United States Patent
Doyle

[19]

[11] Patent Number: 6,032,577
[45] Date of Patent: Mar. 7, 2000

[54] METHOD AND APPARATUS FOR TRANSPORTING SUBSTRATES

[75] Inventor: Dennis G. Doyle, Shrewsbury, Mass.

[73] Assignee: MPM Corporation, Franklin, Mass.

[21] Appl. No.: 09/033,231

[22] Filed: Mar. 2, 1998

[51] Int. Cl.[7] .................................................. B41M 1/12
[52] U.S. Cl. ........................................ 101/129; 101/485
[58] Field of Search ................................. 101/114, 123, 101/124, 126, 129, 44, 43, 485

[56] References Cited

U.S. PATENT DOCUMENTS

| | | |
|---|---|---|
| 3,688,690 | 9/1972 | Gabbrielli .................................. 101/35 |
| 4,540,084 | 9/1985 | Curti ......................................... 101/126 |
| 4,567,822 | 2/1986 | Heidenreich et al. . |
| 4,649,635 | 3/1987 | Asai et al. . |
| 4,813,352 | 3/1989 | Ericsson .................................. 101/126 |
| 4,946,021 | 8/1990 | Murphy . |
| 5,009,306 | 4/1991 | Roderick et al. . |
| 5,452,656 | 9/1995 | Becher et al. ........................... 101/126 |
| 5,730,051 | 3/1998 | Takahashi et al. ...................... 101/126 |
| 5,740,729 | 4/1998 | Hikita et al. ............................. 101/126 |
| 5,873,939 | 2/1999 | Doyle et al. . |

*Primary Examiner*—Ren Yan
*Attorney, Agent, or Firm*—Mintz, Levin, Cohn, Ferris, Glovsky and Popeo, P.C.

[57] ABSTRACT

A method and apparatus is provided for transporting circuit boards in a screen printer. In embodiments of the present invention, a transportation system is provided for a printer that prints material on a substrate. The transportation system has the ability to independently move substrates from one position to another within the printer without moving other substrates contained within the transportation system. In one embodiment, the transportation system includes a conveyor system and a plurality of lifters that lift substrates off of the conveyor system to prevent at least one substrate from moving when other substrates are moved by the conveyor system. In another embodiment, the transportation system includes a conveyor system and a plurality of retractable pins, that are individually controllable to be raised above the conveyor system to contact at least one substrate on the conveyor system and prevent the substrate from moving when other substrates are moved by the conveyor system.

13 Claims, 6 Drawing Sheets

METHOD AND APPARATUS FOR TRANSPORTING SUBSTRATES

FIELD OF THE INVENTION

The present invention relates generally to the field of electronics manufacturing, and more specifically to an improved apparatus and method for transporting substrates, such as circuit boards, in a screen or stencil printer that prints solder paste on a surface of the substrates.

BACKGROUND OF THE INVENTION

In a typical surface mount electronic circuit board manufacturing facility, a number of independent machines, each of which performs a different operation, are used in an assembly line to manufacture circuit boards. One typical example of a circuit board assembly line 10 is shown in block format in FIG. 1. The assembly line includes a circuit board loader 12, a stencil printer 14, a pick and place machine 16 and a reflow oven 18. The machines in the assembly line are interconnected using a number of conveyor segments 20.

In the assembly line 10, the circuit board loader 12 provides a bare circuit board to the stencil printer wherein solder paste is printed onto pads of the circuit board in a predetermined pattern defined by a stencil loaded into the stencil printer. The stencil printer then passes the circuit board to the pick and place machine 16, wherein electrical components are placed onto the solder paste on the circuit board. Next, the circuit board is passed to the reflow oven, wherein the circuit board is subjected to a sufficiently high temperature to cause the solder paste to flow to secure the components to the board and provide proper electrical connections between the components and the circuit board.

One example of a stencil printer 14 is shown in FIG. 2. Stencil printers, like that shown in FIG. 2, are available from MPM Corporation, Franklin MA, the assignee of the present invention, and include model numbers Ultraprint 2000, Ultraprint 2500 and Ultraprint 3000. The stencil printer 14 includes a frame 22 that supports components of the stencil printer including a controller 24 with a user interface 26, a stencil 28, and a dispensing head 30 having a dispensing slot 32 from which solder paste is dispensed. When a circuit board 36 is loaded into the stencil printer and properly aligned in the printer, a z-axis work table lifts the circuit board to place the circuit board against, or in close proximity with, the stencil of the printer so that printing can occur. The dispensing head 30 is then placed over the stencil and moved across the stencil while solder paste is dispensed through the slot 32, causing the solder paste to be printed onto the circuit board. The operation of the dispensing head 30 is further described in co-pending U.S. patent application No. 08/966, 057 to Freeman et. al, which is assigned to the assignee of the present invention, and incorporated by reference herein. As known to those skilled in the art, some prior art stencil printers utilize one or more squeegee blades with a paste dispensing mechanism in place of the dispensing head described above.

The stencil printer 14 includes a conveyor 34 for loading/ unloading and for positioning circuit boards in a print area above the z-axis work table of the screen printer. The conveyor 34 of the stencil printer is positioned to receive circuit boards from and deliver circuit boards to conveyor sections 20 of an assembly line, as shown in FIG. 1, to move circuit boards between the machines in the assembly line. Typical inline circuit board manufacturing machines, such as those shown in FIG. 1, communicate with each other using standard protocols defined by the Surface Mount Equipment Manufacturer's Association (SMEMA) to transfer substrates such as circuit boards between the machines. For example, using SMEMA protocols, the stencil printer 14 signals to the pick and place machine that it has a circuit board ready to transfer to the pick and place machine, and when the pick and place machine signals to the stencil printer that it is ready to receive the circuit board, then the circuit board is transferred over conveyor section 20.

To reduce the time and conveyor travel distance required to load and unload circuit boards, in some prior art stencil printers, conveyor 34 in the stencil printer is comprised of three independently controllable conveyor segments 34a, 34b and 34c. The three segments define three circuit board positions identified as a pre-print position 38, a print position 40 and a post-print position 42. Circuit boards are initially loaded into the pre-print position 38, move to the print position 40 within the print area 44 of the screen printer, and after printing, move to the post-print position 42 to wait to be unloaded from the stencil printer. The use of independently controllable conveyor segments allows circuit boards to be loaded and unloaded in a more flexible manner to meet demands of the other machines of an assembly line without waiting for a print cycle to be completed, thereby lowering the idle time of the machines, and allowing the assembly line to operate in an asynchronous manner.

Although the use of three conveyor segments for the conveyor in a stencil printer has advantages over the use of a single conveyor segment, this approach is relatively expensive, is complex and typically requires a significant amount of space for the mechanical and electrical components used to implement the three conveyor segment approach.

SUMMARY OF THE INVENTION

Embodiments of the present invention provide a method and apparatus for transporting circuit boards in a screen printer having the advantages of a three conveyor segment conveyor system, without the above-described disadvantages.

In a first embodiment of the present invention, a transportation system is provided for a printer that prints material on a substrate. The transportation system loads substrates into the printer, unloads substrates from the printer and transports substrates between positions within the printer. The transportation system includes a conveyor disposed within the printer that receives a substrate to be printed on, and that moves the substrate to predetermined substrate positions in the printer, wherein at least one of the predetermined substrate positions is a print position at which the material is printed onto the substrate, and means for independently controlling movement of a plurality of substrates on the conveyor.

In one version of the first embodiment, the means for independently controlling movement includes at least one device that lifts at least one substrate off of the conveyor such that the substrate does not move in response to movement of the conveyor.

In another version of the first embodiment, the means for independently controlling includes a least one pin having an activated position in which at least one substrate is prevented from moving beyond the pin on the conveyor.

Another embodiment of the present invention is directed to a method of printing material on substrates using a printer having a transportation system that transports the substrates to positions within the printer. The method includes steps of transferring a first substrate to a print position in the printer using the transportation system, raising the first substrate off of the transportation system to print the material on the substrate, transferring a second substrate to a pre-print position in the printer while the first substrate is raised off of the transportation system and raising the second substrate off of the transportation system, transferring the first substrate to a post-print position and raising the first substrate off of the transportation system, lowering the second substrate onto the transportation system, transferring the second substrate to the print position and raising the second substrate off of the transportation system to print material on the second substrate, and while the first and second substrates are raised above the transportation system, transferring a third substrate to the pre-print position and raising the third substrate off of the transportation system.

The method may further include steps of lowering the first substrate back onto the transportation system, and transferring the first substrate from the post-print position.

BRIEF DESCRIPTION OF THE DRAWINGS

For a better understanding of the present invention, reference is made to the drawings which are incorporated herein by reference and in which.

DETAILED DESCRIPTION

For purposes of illustration, embodiments of the present invention are described herein with reference to a stencil printer for printing solder paste on a substrate such as a circuit board. One skilled in the art will appreciate, however, that embodiments of the present invention are not limited to stencil printers, but rather, may be used in other equipment that utilizes conveyors or similar transportation systems for loading and unloading workpieces or substrates. In addition, the terms screen and stencil may be used interchangeably herein to describe a device in a printer that defines a pattern to be printed on a substrate.

In embodiments of the present invention, a single segment conveyor system for a stencil printer is provided having multiple substrate positions defined thereon, and having the capability for independently loading substrates into the printer, unloading substrates from the printer, and moving substrates from one position to another position on the conveyor system without moving all other substrates.

Figure 1:
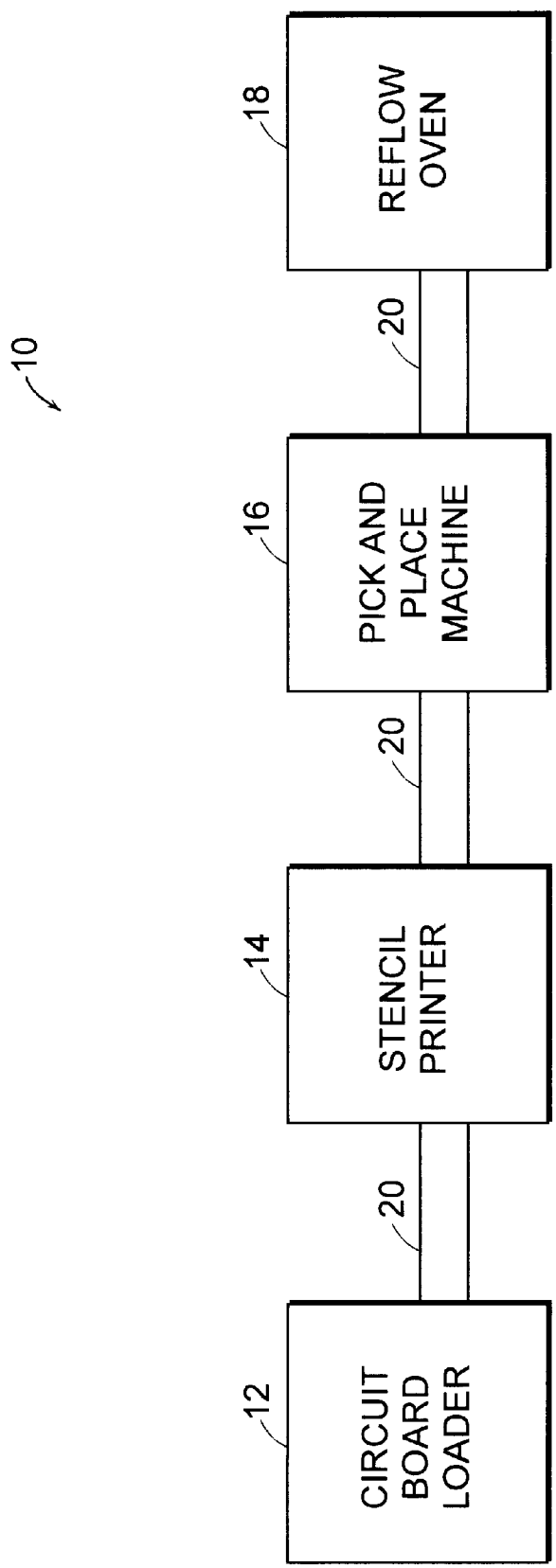
FIG. 1 is a block diagram of a typical inline operation for manufacturing electronic circuit boards.
Figure 2:
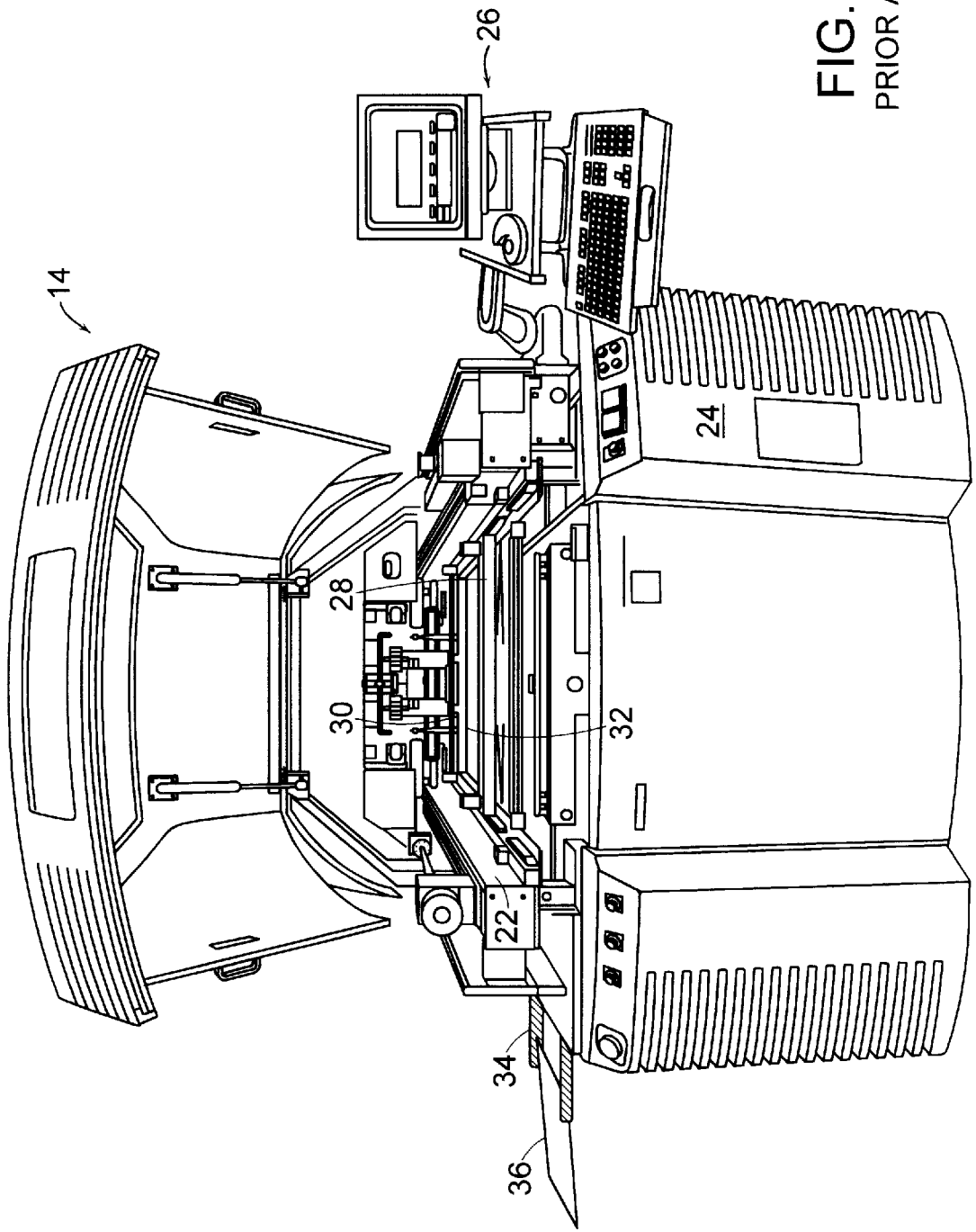
FIG. 2 is a front-view of a typical screen printer used in the inline operation shown in FIG. 1.
Figure 3:
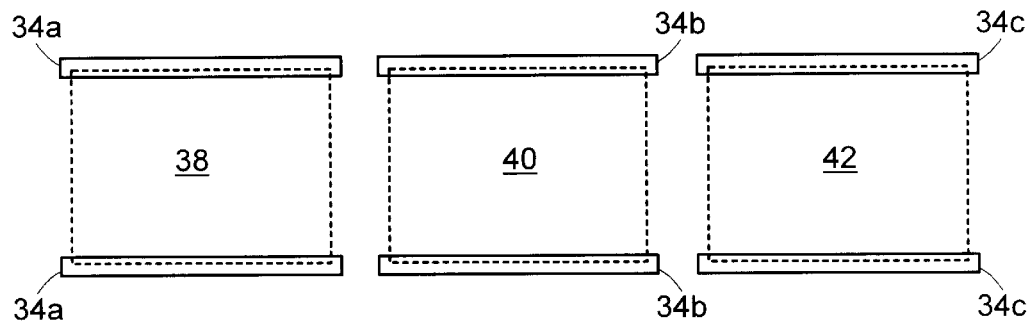
FIG. 3 is an illustration of a typical three segment conveyor used in prior art screen printers.
Figure 4:
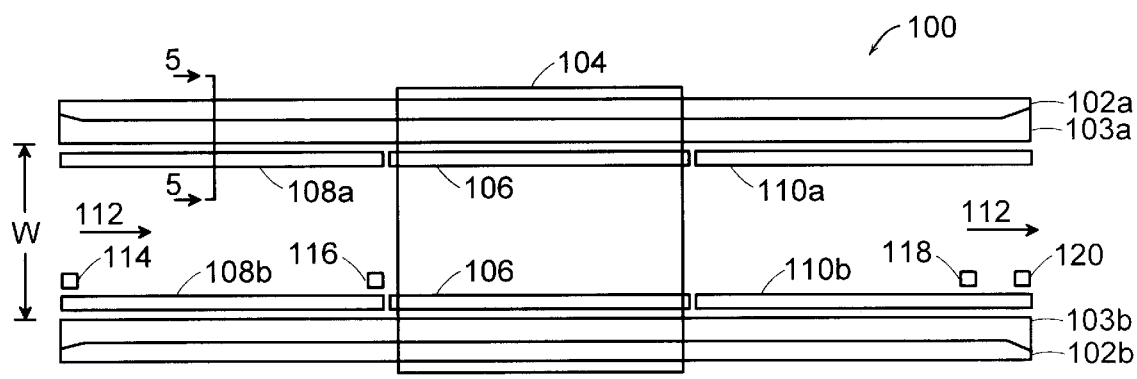
FIG. 4 is an illustration of a top view of a conveyor system in accordance with a first embodiment of the present invention.

A top view of a first embodiment of the present invention of a conveyor system 100 for a stencil printer, such as stencil printer 14 of FIG. 2, is shown in FIG. 4. The conveyor system 100, has a pair of transport rails 102a and 102b having conveyor belts 103a and 103b for transporting circuit boards within a stencil printer, and has a print area 104, that is positioned over the z-axis work table in the printer. The z-axis work table has worknest tooling 106 for raising circuit boards off of the conveyor belts to place the circuit boards in proximity with the stencil of the printer when printing is to occur. The conveyor system 100 also has a pair of pre-print queue circuit board lifters 108a and 108b, a pair of post-print queue circuit board lifters 110a and 110b, and four circuit board sensors 114, 116, 118 and 120. The conveyor system 100 shown in FIG. 4 transfers circuit boards in the direction shown by arrows 112, so that circuit boards enter the conveyor system near circuit board sensor 114, and printed circuit boards exit the conveyor system near circuit board sensor 120.

Each pair of circuit board lifters 108a and 108b, and 110a and 110b is disposed within the conveyor system 100, so that under the control of the controller of a stencil printer, each pair of lifters can raise a circuit board off of the conveyor belts 103a and 103b to prevent the circuit board from moving with the conveyor belts. Circuit board sensors 114, 116, 118 and 120 are used to detect positions of circuit boards in the conveyor system and to report the positions to the controller of the stencil printer. In one embodiment of the present invention, the sensors may be implemented using one of a number of optical techniques as known in the art.

Figure 5:
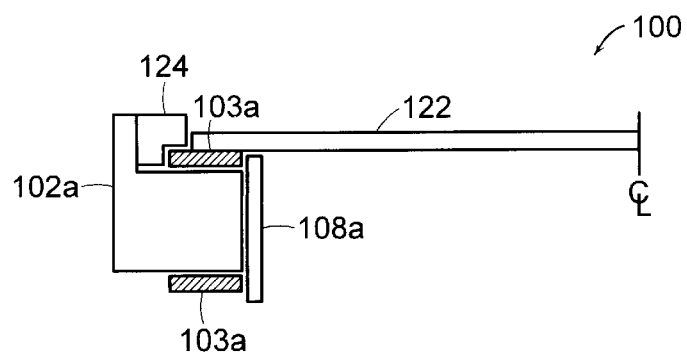
FIG. 5 is an illustration of a cross-sectional side view of the conveyor system of FIG. 4 with a circuit board in a lowered position.

FIG. 5 is a cross-sectional view of the conveyor system 100, taken along line 5—5 of FIG. 4, with a circuit board 122 loaded in a transport or lowered position in the conveyor system 100. Only one of the transfer rails 102a is shown in the cross-sectional view of FIG. 5. The other transfer rail 102b is substantially identical to transfer rail 102a. In FIG. 5, the circuit board 122 is disposed on the conveyor belt 103a adjacent a rail cap 124 which is used to maintain the conveyor belt in its proper position on the transfer rail 102a. In the transport position shown in FIG. 5, the circuit board lifter 108a is below the circuit board 122 allowing the circuit board to rest on the conveyor belt and move with the conveyor belt.

Figure 6:
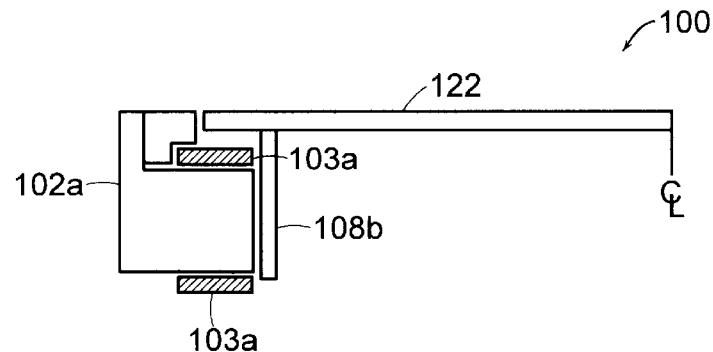
FIG. 6 is an illustration of a cross-sectional side view of the conveyor system of FIG. 4 with a circuit board in a raised position.

FIG. 6 shows a cross-sectional view, similar to FIG. 5, except that in FIG. 6, the circuit board is in a lifted position off of the conveyor belt, preventing the circuit board from moving with the conveyor belt. To place the circuit board in the lifted position, pneumatic cylinders and mechanical linkages, under the control of the controller of the printer, are activated causing lifters 108a and 108b to rise, lifting the circuit board 122 off of the conveyor belts.

Figure 7:
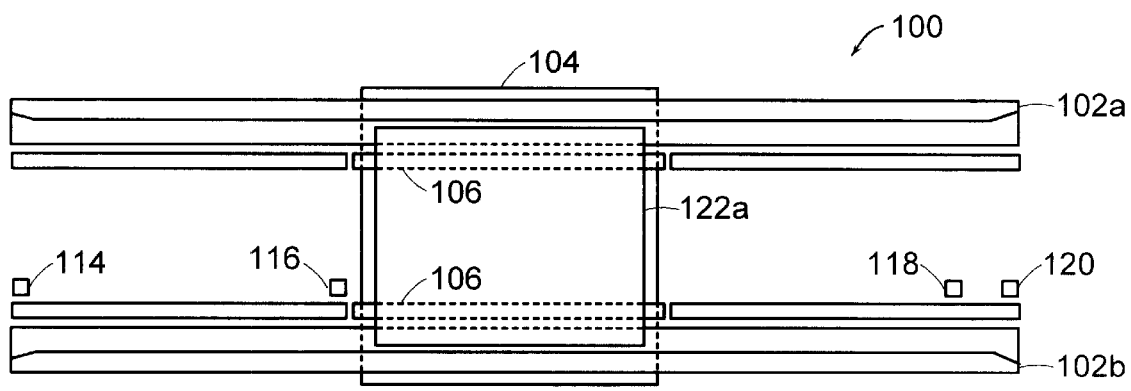
FIG. 7 is an illustration showing the top view of the conveyor system of FIG. 4 with a first circuit board located at a print position on the conveyor system.
Figure 8:
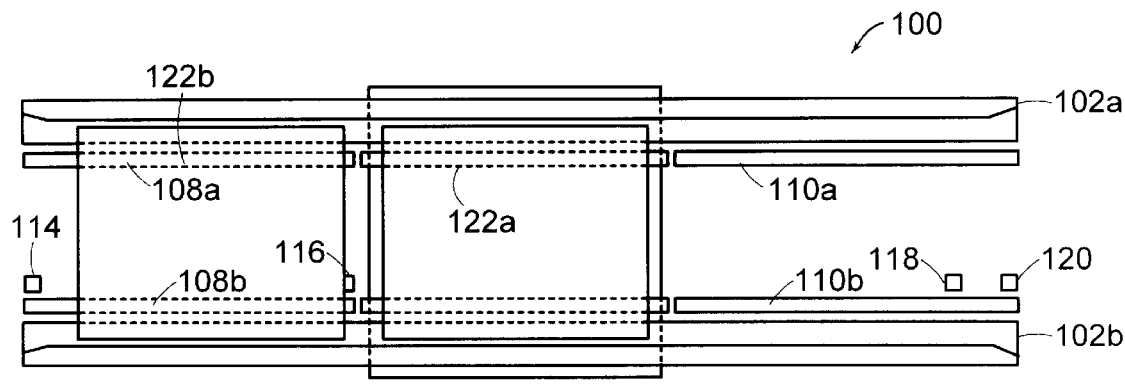
FIG. 8 is an illustration showing the top view of the conveyor system of FIG. 4 with a first circuit board located at a print position on the conveyor system and a second circuit board located at a pre-print queue position on the conveyor system.

Operation of the conveyor system 100 in a stencil printer will now be described. Initially, a first circuit board 122a is loaded in the conveyor system and transported to the print area above the z-axis tower, as shown in FIG. 7. Circuit board 122a is then lifted off of the conveyor belt by the worknest tooling to place the circuit board against the stencil for printing. A second circuit board 122b is then loaded into the stencil printer using the conveyor. When sensor 116 detects the front edge of the circuit board, the conveyor is stopped, and circuit board lifters 108a and 108b are activated to lift circuit board 108b off of the conveyor belts. Circuit board 122b is then positioned at a pre-print queue position, defined by the pre-print queue circuit board lifters 108a and 108b, as shown in FIG. 8. While the second circuit board 122b is transported to the pre-print queue position, the first circuit board 122a remains in the position shown in FIG. 7, since it is disposed above the conveyor belts.

Figure 9:
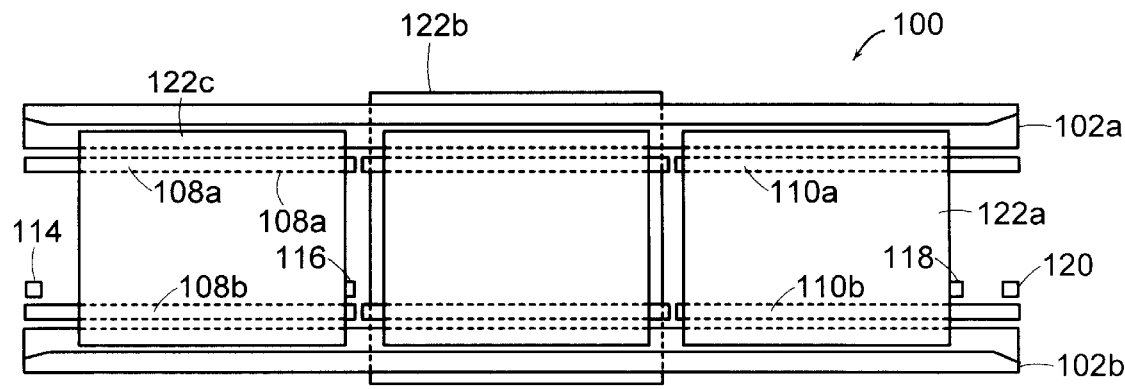
FIG. 9 is an illustration showing the top view of the conveyor system of FIG. 4 with a first circuit board located at a post-print queue position, a second circuit board located at a print position and a third circuit board located at a pre-print queue position.

When printing on the first circuit board 122a is completed, the first circuit board 122a is lowered back onto the conveyor belts, and the conveyor belts are actuated by the controller to move the first circuit board 122a to a post-print queue position, defined by the post-print circuit board lifters 110a and 110b. When the front edge of circuit board 122a is detected by sensor 118, the conveyor stops, and circuit board lifters 110a and 110b lift circuit board 122a off of the conveyor belts. The second circuit board 122b is then lowered onto the conveyor, moved into the print position and then lifted off of the conveyor belts for printing. While printing is occurring on the second circuit board, a third circuit board 122c may be loaded into the conveyor system and positioned at the pre-print queue position in a manner similar to that described above for the second circuit board. FIG. 9 shows a top view of the conveyor system 100 with the first circuit board 122a at the post-print queue position, the second circuit board 122b at the print position and the third circuit board 122c at the pre-print queue position.

Once the machine downstream of the screen printer is ready to receive the first circuit board, the first circuit board 122a is lowered onto the conveyor belts, and the conveyor belts are activated to transport circuit board 122a from the stencil printer. The first circuit board may be transported from the screen printer while printing is occurring on the second circuit board. When printing on the second circuit board has completed, the second circuit board is moved to the post-print position, the third circuit board is moved to the print position, and a fourth circuit board may be loaded into the stencil printer.

In embodiments of the present invention, the controller of the screen printer is programmed to control the circuit board lifters, to control the conveyor, and to respond to the sensors to provide the operation described above. In addition, the controller is programmed to control the circuit board lifters and conveyor belts in response to commands (for example, commands using the SMEMA defined protocols) received from upstream and downstream machines in an assembly line.

In the embodiment described above, each of the circuit boards shown in the figures are of approximately the maximum size that the stencil printer is designed to accommodate, since the boards occupy most of the print area of the stencil printer. It is often desirable to print on circuit boards that occupy a significantly less portion of the print area than the boards described above, and in some prior art screen printers, the width W (see, FIG. 4) between the transport rails of the conveyor system is adjustable. In embodiments of the present invention, to accommodate smaller circuit boards, the width W between the transport rails is adjustable, and in addition, the length of the circuit board lifters and the effective length of the worknest tooling in the print area are adjustable using various length parts that can be quickly interchanged. The ability to adjust the circuit board lifters allows circuit boards in the pre-print and post-print queue positions to extend into the print area to reduce the time required to transport circuit boards between positions in the conveyor system.

Figure 10:
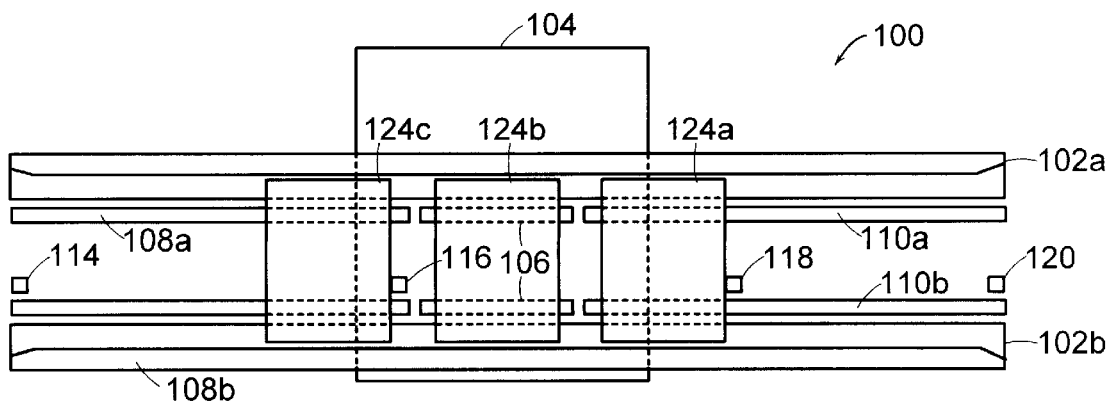
FIG. 10 is an illustration showing a top view of a conveyor system in accordance with one embodiment of the present invention having adjustable circuit board lifters to accommodate different size circuit boards.

FIG. 10 shows the conveyor system 100 adjusted to accommodate circuit boards 124a, 124b and 124c that are significantly smaller than the print area of the screen printer. As shown in FIG. 104, the effective length of the worknest tooling, used to lift the circuit boards in the print area, has been reduced, and the length of each of the circuit board lifters 108a, 108b, 110a and 110b has been increased so that each of the circuit board lifters extends into the print area. The positions of sensors 116 and 118 have also been adjusted to accommodate the smaller circuit boards.

By extending the circuit board lifters into the print area, the time required to load circuit boards into and remove them from the print position is reduced, thereby reducing the total print cycle time of the circuit boards. In typical prior art screen printers that utilize a conveyor system having three separate conveyor segments, the length of each of the segments is not adjustable, and each segment is usually sized based on the maximum size circuit board that the stencil printer can accommodate. Therefore, in these prior art systems, the transport time for loading and unloading smaller circuit boards is typically greater than in the embodiments of the present invention described above.

It is desirable that the circuit boards used with embodiments of the present invention described above have sufficient edge clearance between the edge of the circuit boards and any components mounted on the underside of the circuit boards, so that the circuit board lifters do not contact any underside components. In embodiments of the present invention, the desired edge clearance for circuit boards to be used with the circuit board lifters is approximately 5 mm In an alternate embodiment of a conveyor system in accordance with the present invention, which is particularly beneficial when sufficient edge clearance on the circuit boards is not available, the circuit board lifters are replaced with retractable board stops. The board stops have a retracted position in which they are disposed below the conveyor system and can be raised to an engaged position to contact a front edge of a circuit board. In the engaged position, the board stops contact the front edge of a circuit board to prevent the circuit board from moving with the conveyor belts. In one embodiment, at least one board stop is provided at the pre-print queue position and at the post-print queue position. The board stops are controlled by the controller of a stencil printer in a manner similar to the circuit board lifters discussed above, however, in this embodiment, rather than lifting the circuit boards off of the conveyor, the circuit boards are held in position by the board stops while the conveyor slides under them.

Figure 11:
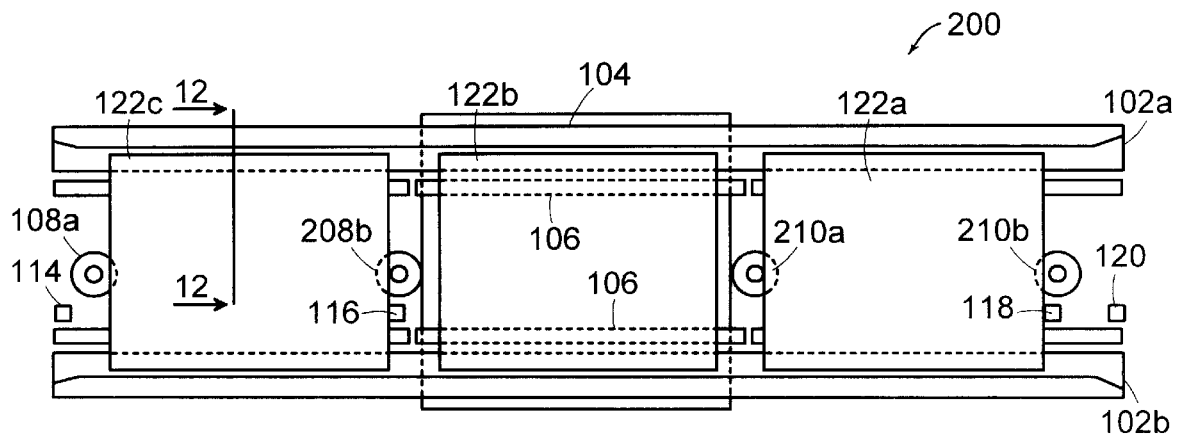
FIG. 11 is an illustration showing a top view of a conveyor system in accordance with a second embodiment of the present invention.
Figure 12:
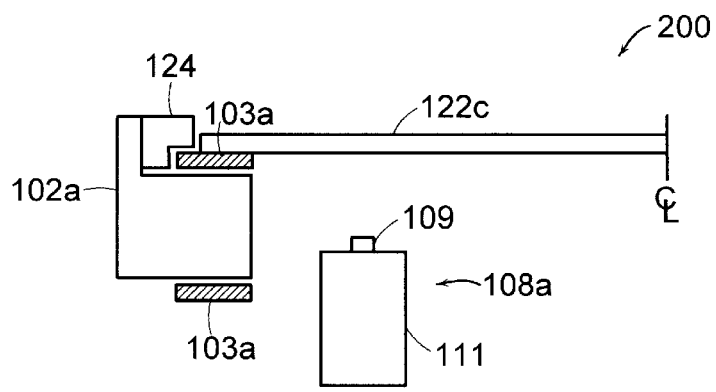
FIG. 12 is an illustration of a cross-sectional side view of the conveyor system of FIG. 11 showing a circuit board stop in a retracted position.
Figure 13:
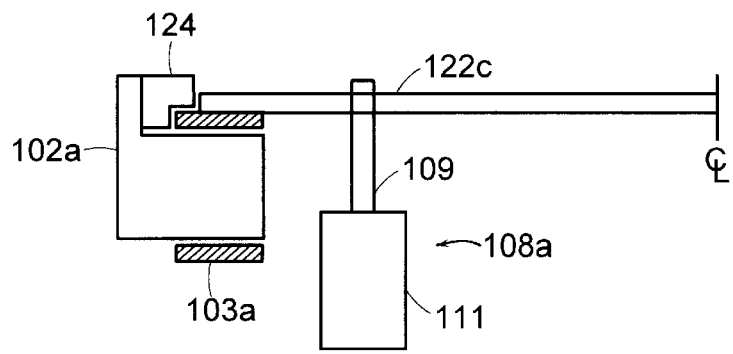
FIG. 13 is an illustration showing the cross-sectional side view of the conveyor system of FIG. 11 with the circuit board stop in an engaged position.

FIG. 11 shows a conveyor system 200 that is similar to the conveyor system 100 discussed above and similar components are identified with the same reference numbers. Conveyor system 200 differs from conveyor system 100 in that the circuit board lifters in the conveyor system 100 have been replaced by four retractable circuit board stops 208a, 208b, 210a, 210b. A first pair of the circuit board stops 208a and 208b are used to maintain a circuit board (such as circuit board 122c of FIG. 11) in the pre-print queue position, and a second pair of circuit board stops are used to maintain a circuit board (such as circuit board 122a of FIG. 11) in the post-print queue position, FIGS. 12 and 13 show a cross-sectional view of the conveyor system 200 taken along line 12—12 of FIG. 11. In FIG. 12, circuit board stop 108a is shown in a retracted position, and in FIG. 13 circuit board stop 108b is shown in an engaged position. In the retracted position, the circuit board 122c is allowed to move with the conveyor belt 103a, and in the engaged position, the circuit board 122c is prevented from moving with the conveyor belt. As shown in FIGS. 12 and 13, circuit board stop 108a, as well as circuit board stops 108b, 108c and 108d, are implemented using a pneumatic cylinder 111 having a pin 109 that may be engaged by providing pressurized air to the pneumatic cylinder, as is known to those skilled in the art. In one embodiment of the present invention, the circuit board stops are implemented using standard pneumatic cylinders as known in the art. In other embodiments of the present invention, the circuit board stops may be implemented using one of a number of devices, using an electrical actuator, a pneumatic actuator or some other type of actuator for engaging and retracting a pin, a piston or some similar device.

The use of circuit board stops to control movement of circuit boards has several advantages. First, they are relatively simple to implement, and can be easily made adjustable to accommodate different board sizes. Second, for printing on smaller circuit boards, the board stops can easily be moved into the print area of the screen printer, since little hardware is needed to implement the board stops.

In one embodiment of the present invention that utilizes circuit board stops at the pre-print and post-print queue positions, a circuit board stop is also used in conjunction with the worknest tooling to stop circuit boards at the proper print position below the stencil. In embodiments of the present invention that use circuit board lifters, the conveyor belts can be reversed to properly place circuit boards below the stencil. However, if the conveyor belts are reversed in the embodiments that use circuit board stops, then any boards at the pre-print or post-print positions will be undesirably moved backwards in the conveyor system. To prevent this backward movement, additional circuit board stops are provided, as shown in FIG. 11, that contact the back edge of circuit boards and hold the circuit boards at the proper position in the conveyor system when the conveyor belts are reversed. By including a circuit board stop to stop circuit boards at the print position, the control of the conveyor system is simplified, and circuit board stops 208a and 210a can be removed.

In embodiments of the present invention discussed above, stencil printers having single segment conveyor systems with independently controllable, circuit board positions have been described. In other embodiments of the present invention, a conveyor system may consist of at least one segment having multiple independently controllable circuit board positions and at least one other segment having one, or more than one, circuit board position. For example, to provide additional flexibility in a screen printer, a pre-print position may have a dedicated conveyor segment and the print and post-print positions may share a conveyor segment with the print and post-print positions being independently controllable.

In embodiments of the present invention discussed above, conveyor systems having three circuit board positions have been described. As understood by one skilled in the art, the present invention is not limited to a conveyor system with three circuit board positions, but rather, includes conveyor systems having either more or less than three positions.

Embodiments of the present invention have been described above as being used with stencil printers that print solder paste on circuit boards. As understood by those skilled in the art, embodiments of the present invention are not limited to systems that print on circuit boards, but also include systems that print on other substrates, such as wafers or cards.

Embodiments of the present invention have been described as being implemented in a stencil printer. In a preferred embodiment of the present invention, two conveyor systems in accordance with one of the above-described embodiments are incorporated in a stencil printer having a dual track mode, such as the Ultraprint 2500 stencil printer available from MPM Corporation, Franklin, MA, and as described in U.S. patent application Ser. No. 08/802,934, entitled "Dual Track Stencil/Screen Printer and U.S. patent application Ser. No. 08/920,121, entitled "Dual Track Stenciling System With Solder Gathering Head," both of which are assigned to the assignee of the present invention and incorporated herein by reference. In a dual lane printer, there is a desire to have additional flexibility in transferring circuit boards within the printer, since a dual lane printer can accommodate a greater number of circuit boards at a time, and can therefore encounter more significant queuing issues.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A method of printing material on substrates using a printer having a transportation system that transports the substrates to positions within the printer, the method comprising steps of:
    (a) transferring a first substrate to a print position in the printer using the transportation system;
    (b) raising the first substrate off of the transportation system to print the material on the substrate utilizing a first substrate lifter;
    (c) transferring a second substrate to a pre-print position in the printer while the first substrate is raised off of the transportation system;
    (d) transferring the first substrate to a post-print position while maintaining the second substrate at the pre-print position; and
    (e) transferring the second substrate to the print position while maintaining the first substrate at the post-print position by raising the first substrate off of the transportation system utilizing a second substrate lifter.

2. The method of claim 1, further comprising a step of transferring a third substrate to the pre-print position while maintaining the first substrate at the post-print position.

3. The method of claim 1, wherein step (d) includes a step of raising the second substrate off of the transportation system utilizing the first substrate lifter.

4. The method of claim 1 wherein the transportation system includes a single conveyor belt mechanism that is contiguous through a plurality of predetermined positions.

5. The method of claim 4 wherein the plurality of predetermined positions include a pre-print position, a print position, and a post-print position.

6. A method of printing material on substrates using a printer having a transportation system that transports the substrates along a path to positions within the printer, the method comprising steps of:

(a) transferring a first substrate to a print position in the printer using the transportation system;

(b) raising the first substrate off of the transportation system to print the material on the substrate utilizing a first substrate lifter;

(c) transferring a second substrate to a pre-print position in the printer while the first substrate is raised off of the transportation system;

(d) transferring the first substrate to a post-print position while maintaining the second substrate at the pre-print position by holding the second substrate in place using a pin that is extendable into the path of the second substrate; and (e) transferring the second substrate to the print position while maintaining the first substrate at the post-print position.

7. The method of claim 6 wherein the transportation system includes a single conveyor belt mechanism that is contiguous through a plurality of predetermined positions.

8. The method of claim 7 wherein the plurality of predetermined positions include a pre-print position, a print position and a post-print position.

9. A method of printing material on substrates using a printer having a transportation system that transports the substrates along a path to positions within the printer, the method comprising steps of:

(a) transferring a first substrate to a print position in the printer using the transportation system;

(b) raising the first substrate off of the transportation system to print the material on the substrate utilizing a first substrate lifter;

(c) transferring a second substrate to a pre-print position in the printer while the first substrate is raised off of the transportation system;

(d) transferring the first substrate to a post-print position while maintaining the second substrate at the pre-print position; and (e) transferring the second substrate to the print position while maintaining the first substrate at the post-print position by holding the first substrate in place using a pin that is extendable into the path of the second substrate.

10. The method of claim 9 wherein the transportation system includes a single conveyor belt mechanism that is contiguous through a plurality of predetermined positions.

11. The method of claim 10 wherein the plurality of predetermined positions include a pre-print position, a print position, and a post-print position.

12. A method of printing material on substrates using a printer having a transportation system that transports the substrates along a path to positions within the printer, the method comprising steps of:

(a) transferring a first substrate to a print position in the printer using the transportation system wherein the transportation system includes a single conveyor belt mechanism that is contiguous through a plurality of predetermined positions;

(b) raising the first substrate off of the transportation system to print the material on the substrate utilizing a first substrate lifter;

(c) transferring a second substrate to a pre-print position in the printer while the first substrate is raised off of the transportation system;

(d) transferring the first substrate to a post-print position while maintaining the second substrate at the pre-print position; and (e) transferring the second substrate to the print position while maintaining the first substrate at the post-print position by raising the first substrate off of the transportation system utilizing a second substrate lifter.

13. The method of claim 12 wherein the plurality of predetermined positions include a pre-print position, a print position and a post-print position.

* * * * *